US008571502B2

(12) United States Patent
Frank

(10) Patent No.: US 8,571,502 B2
(45) Date of Patent: Oct. 29, 2013

(54) ADJUSTING PLL CLOCK SOURCE TO REDUCE WIRELESS COMMUNICATION INTERFERENCE

(75) Inventor: Michael Frank, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 308 days.

(21) Appl. No.: 12/949,541

(22) Filed: Nov. 18, 2010

(65) Prior Publication Data

US 2012/0126872 A1 May 24, 2012

(51) Int. Cl.
*H04B 1/18* (2006.01)

(52) U.S. Cl.
USPC ........................................ 455/180.3; 455/260

(58) Field of Classification Search
USPC ................. 455/566, 118, 119, 120, 121, 126, 455/180.3, 260
See application file for complete search history.

(56) References Cited

U.S. PATENT DOCUMENTS

| | | |
|---|---|---|
| 7,193,543 B1 | 3/2007 | McLeod et al. |
| 7,580,691 B1 | 8/2009 | Reed et al. |
| 7,634,028 B2 | 12/2009 | Crawley |
| 7,787,569 B2 | 8/2010 | Hayem et al. |
| 7,804,920 B2 | 9/2010 | Deisher et al. |
| 2006/0014513 A1* | 1/2006 | Uozumi et al. ............... 455/323 |
| 2009/0111408 A1* | 4/2009 | Rodal ......................... 455/182.3 |
| 2009/0138745 A1 | 5/2009 | Dorsey et al. |

* cited by examiner

*Primary Examiner* — Ping Hsieh

(74) *Attorney, Agent, or Firm* — Meyertons, Hood, Kivlin, Kowert & Goetzel P.C.

(57) ABSTRACT

Adjusting a phase locked loop (PLL) clock source to reduce wireless communication (e.g., radio frequency (RF)) interference within a device. The PLL may be included in a high speed serial interface, e.g., coupled to a display, and may be initially driven by a first clock. Later, when a second clock is available and aligned with the first clock, the PLL may be driven by the second clock. The second clock may be configured to change its frequency over time such that the PLL does not lose lock and also does not interfere (or reduces interference) with wireless communication of the device. For example, the second clock may be programmable or may dynamically vary its operating frequency, thereby reducing its interference with the wireless communication of the device.

23 Claims, 12 Drawing Sheets

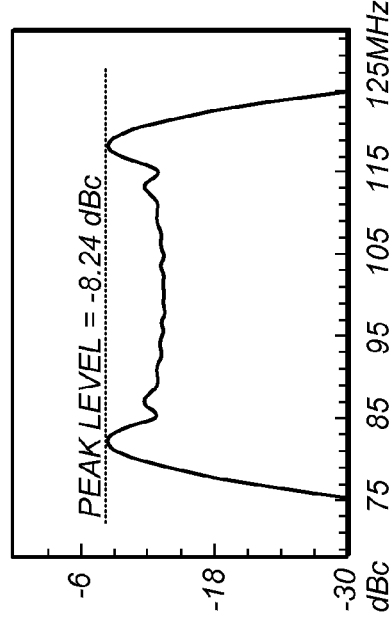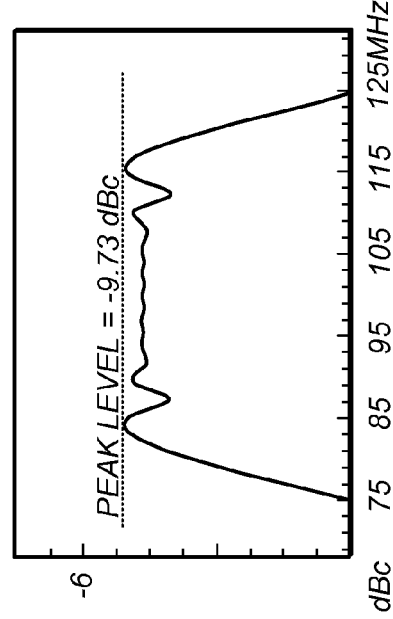
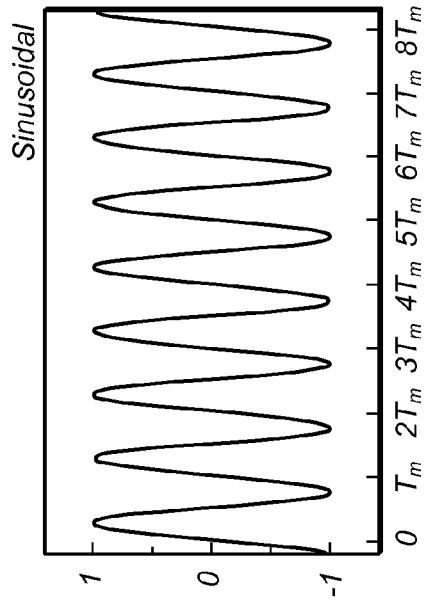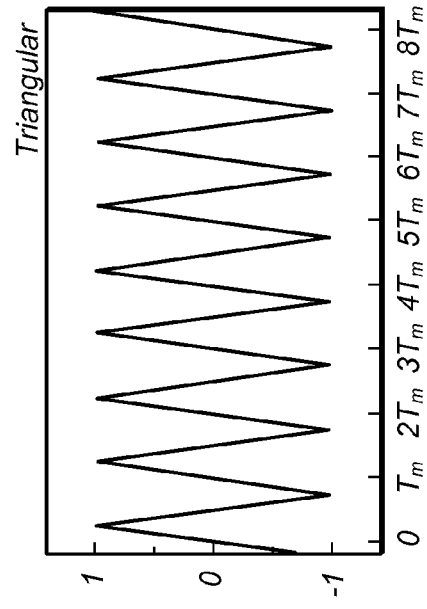
FIG. 5A
FIG. 5B

ADJUSTING PLL CLOCK SOURCE TO REDUCE WIRELESS COMMUNICATION INTERFERENCE

FIELD OF THE INVENTION

The present invention relates to the field of computers, and more particularly a system and method for adjusting a phase locked loop (PLL) clock source to reduce wireless communication interference.

DESCRIPTION OF THE RELATED ART

Modern electronic devices include clocking signals which are used to keep various components of the device in sync. However, in some mobile devices, e.g., mobile phones, the clocking signals may cause interference within a wireless communication channel. This is often exacerbated by the fact that the mobile device will often have to use different communication channels to communicate with different devices and/or according to different communication standards. As a result, there may not be a single "safe" frequency in which the clock can operate. Accordingly, improvements in clocking signals within devices are desired.

SUMMARY OF THE INVENTION

Various embodiments are presented of a system and method for changing and adjusting a clock source of a phase locked loop (PLL) to reduce wireless communication interference. For example, the method may be implemented in a wireless device that includes a serial interface (e.g., a high speed serial interface (HSSI) such as mobile industry processor interface (MIPI)) that outputs a clock that is driven by a PLL. The serial output clock (e.g., harmonics of the clock) may interfere with wireless communication channels used during wireless communication. However, it should be noted that the wireless communication channels that are used during wireless communication may vary over time (e.g., in response to different external interference, different wireless communication protocols, different wireless devices in communication with the wireless device, etc.). Accordingly, it may be desirable to drive the PLL with a clock that results in a PLL clock that reduces the interference with the wireless communications. However, such a clock may not be available at all times, so it may also be desirable to switch from driving the PLL with a first clock (e.g., a static clock) to a second clock (e.g., a modulated or programmable clock).

More particularly, at a first time, the first clock may be available, but the second clock may not be available. For example, the first time may be when the wireless device is booting up or initializing. More specifically, the first clock may be based on or from a crystal oscillator that is available whenever the wireless device is turned on. The second clock, however, may be based on various other circuitry (e.g., higher frequency clocks that may depend on various PLLs being initiated or operational). Accordingly, the second clock may not be available during initiation or boot. Accordingly, during the first time, the PLL of the serial interface may be driven by the clock signal of the first clock, which may be a static clock that does not mitigate or reduce interference in the wireless communication channels.

At a later second time (e.g., after boot or initialization of the wireless device), the second clock may become available for use. However, the first clock and second clock may not be aligned when the second clock becomes available. At the second time, were the second clock signal immediately provided to the PLL, a loss of lock may occur due to the misalignment of the clock signals of the first and second clock.

Accordingly, the second clock may be aligned with the first clock, while the clock signals of the first clock are provided to the PLL of the serial interface. For example, the second clock may be aligned with the first clock using a phase detector and a counter. The phase detector may detect whether the two clocks are aligned. If they are not aligned, the phase detector may modify the counter (e.g., either up or down) based on the difference in phase (e.g., whether the phase should be adjusted up or down). The counter may in turn be used to adjust the phase of the second clock. This procedure may be repeated until the two clocks are in phase, e.g., over an average number of clock cycles, such as 100, although other numbers of clock cycles are envisioned.

Once aligned, the clock signals provided to the PLL may be switched from the first clock to the second clock. Since the clock signals are aligned, the switching may not cause a loss of lock by the PLL. The alignment and switchover described above may be controlled by a state machine. Additionally, the alignment may be enabled using an enable bit, e.g., which may be set based on software executing on the wireless device.

As indicated above, the second clock may be an adjustable or modulated (e.g., dithered) clock which causes the serial interface clock to have a lower interference than when using the first, static clock.

More particularly, the second clock may receive first clock frequency information. The first clock frequency information may be any of various information that is usable to generate a first clock frequency. For example, the first clock frequency information may be a divisor that, when applied to a higher frequency clock, produces a clock signal having the first clock frequency. The first clock frequency information may be provided from any of various sources. For example, the first clock frequency may be provided directly from a register specifying the first clock frequency information (e.g., a divisor). In this embodiment, the second clock may be a programmable clock where software (or other portions of the wireless device, such as circuitry or hardware) may modify the frequency of the second clock by modifying the register. For example, the clock may be modified based on a change (or future change) in wireless communication channel use.

In further embodiments, the source of the first clock frequency information may be more elaborate. For example, the first clock frequency information may be based on the information stored in the register, but may be modified by an oscillator. For example, the oscillator may modulate the information stored in the register to produce the first clock frequency information. In some embodiments, instead of a register specifying the clock frequency information, a table of information may be used. For example, the table may store multiple different divisors that may be selectable for provision as the first clock frequency information. Similar to above, this information may be modulated by the oscillator. Further, the oscillator may control a counter that may be used to select the information from the table that is then modulated by the oscillator and provided as the first clock frequency information. In embodiments using the oscillator, the second clock may be a spread spectrum clock that spreads its frequency and harmonics enough that interference of the wireless channels are mitigated without having to specifically change the frequency of the clock based on the wireless channels in use (or future use). Thus, in these embodiments, the clock may be constantly modulated rather than being repeatedly programmed.

In various embodiments, the clock information modulated by the oscillator may specify a "desired clock frequency". For example, the information stored in the register may specify the desired clock frequency of the second clock.

The first clock frequency information may be modified to produce second clock frequency information. For example, the first clock frequency information may be modified by a filter (e.g., a low pass filter). In more detail, the first clock frequency information may specify a clock frequency (e.g., the first clock frequency) that is different from the current clock frequency that is being provided by the second clock. Accordingly, the first clock frequency information may be modified to the second clock frequency information in a manner that prevents the PLL from losing lock in response to the changing clock frequency of the second clock. The first clock frequency information may be modified using transition information (e.g., which may be stored in a register). The transition information may limit the amount of change of the current clock frequency in a manner that allows the PLL to retain lock. For example, the transition information may define a slope for changing the current clock frequency to that specified by the first clock frequency information.

The second clock information may be modified to produce a divisor. For example, the second clock information may be modified by a modulator, such as a sigma delta circuit. Finally, the second clock may receive a higher frequency clock signal and divide that higher frequency clock signal by the divisor to produce the second clock signals. These second clock signals may be provided to the PLL and may mitigate wireless communication interference by changing the clock signals provided by the serial interface.

BRIEF DESCRIPTION OF THE DRAWINGS

A better understanding of the present invention can be obtained when the following detailed description of the preferred embodiment is considered in conjunction with the following drawings, in which:

FIG. 4 illustrates an exemplary diagram of a modulator, according to one embodiment;

FIGS. 5A-5D illustrate different oscillator patterns and resulting clock frequency outputs;

Figure 1:
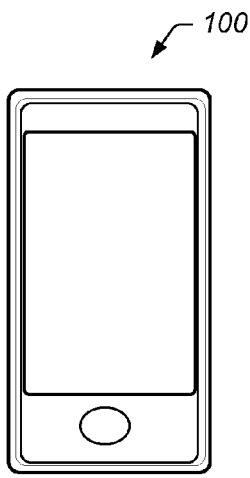
FIG. 1 illustrates an exemplary system for implementing various embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory media which may reside in different locations, e.g., in different computers that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Computer System—any of various types of computing or processing systems, including a personal computer system (PC), mainframe computer system, workstation, network appliance, Internet appliance, personal digital assistant (PDA), personal communication device, smart phone, television system, grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Figure 2:
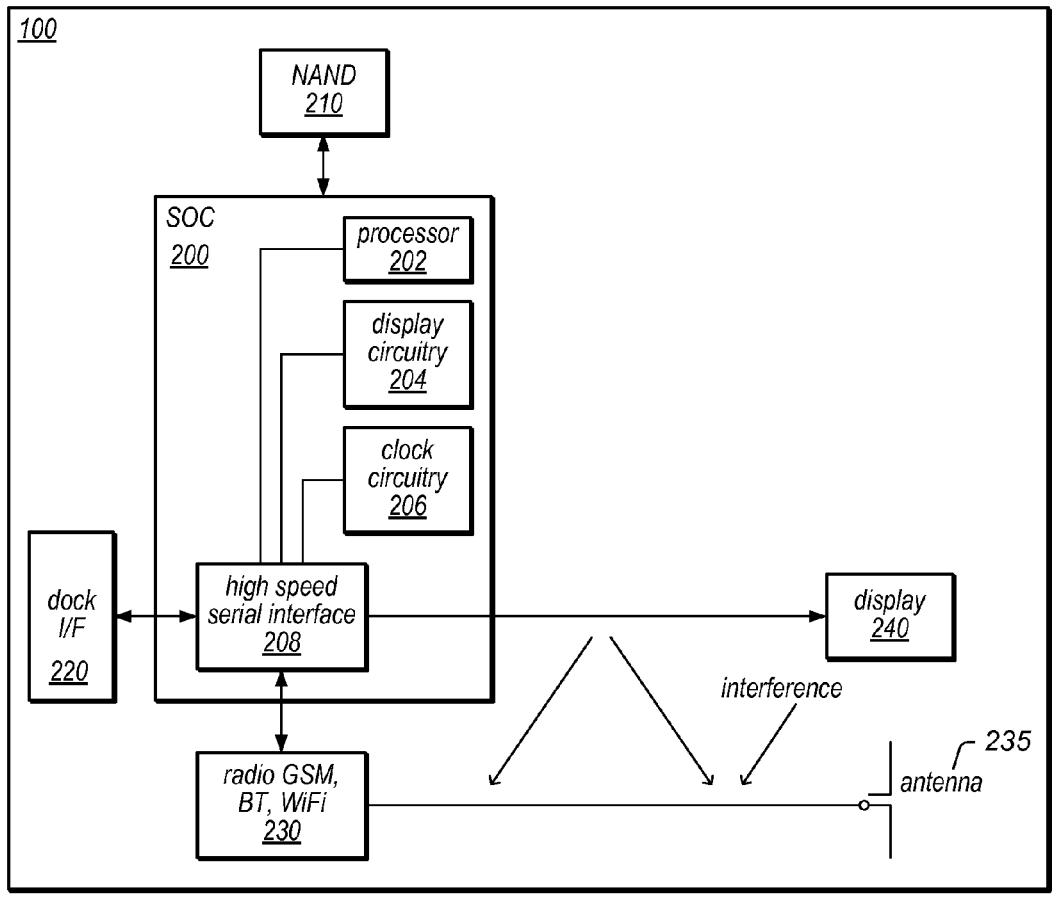
FIG. 2 is an exemplary block diagram of the system of FIG. 1, according to one embodiment.

FIGS. 1 and 2—Exemplary System and Block Diagram

FIG. 1 illustrates an exemplary device 100, which may implement embodiments described herein. The device 100 may be any of various devices. For example, the device 100 may be a portable or mobile device, such as a mobile phone, PDA, audio/video player, etc. In embodiments described herein, the device 100 may be configured to communicate with other devices (e.g., other wireless devices, wireless peripherals, cell towers, access points, etc.) using one or more wireless channels. As used herein, a "wireless device" refers to a device that is able to communicate with other devices or systems using wireless communication. For example, the device 100 may be configured to utilize one or more wireless protocols, e.g., 802.11x, Bluetooth, WiMax, CDMA, GSM, etc., in order to communicate with the other devices wirelessly. The device 100 may also be configured to adjust clocking signals within the device 100 in order to reduce (or eliminate) interference with communication using the wireless channels.

As also shown in FIG. 1, the device 100 may include a display, which may be operable to display graphics provided by an application executing on the target device 100. The application may be any of various applications, such as, for example, games, internet browsing applications, email applications, phone applications, productivity applications, etc. The application may be stored in a memory medium of the device 100. The device 100 may include a central processing unit (CPU) and a graphics processing unit (GPU) which may collectively execute these applications.

FIG. 2 illustrates an exemplary block diagram of the device 100. As shown, the device 100 may include a system on chip (SOC) 200, which may include portions for various purposes, including processor 202, display circuitry 204, and clock circuitry 206, which may all be coupled to serial interface 208 (e.g., a high speed serial interface (HSSI), such as a mobile industry processor interface (MIPI)). The HSSI 208 may provide information to the display 240, including an HSSI clock signal. For example, the display 240 may display graphics according to the HSSI clock signal.

In addition to the SOC 200, the device 100 may include various types of memory, e.g., including NAND 210, a dock interface 220, the display 240, and wireless communication circuitry (e.g., for GSM, Bluetooth, WiFi, etc.) which may use antenna 235 to perform the wireless communication. As shown, there may be interference between the signals provided from the HSSI 208 to the display 240 and the wireless communications using the antenna. For example, the HSSI clocking signals (e.g., harmonics of the HSSI clocking signals) may interfere with one or more wireless communication channels used by the radio 230. Accordingly, as described below, this interference may be mitigated or reduced by adjusting the HSSI clocking signals.

FIGS. 3A-6B—Exemplary Block Diagrams of Clock Circuitry and Associated Figures

FIGS. 3A-3C and 4 illustrate block diagrams of various embodiments of the clock circuitry 206 and HSSI 208 of FIG. 2 above. More particularly, in FIGS. 3A-3C, an exemplary PHY of the HSSI 208 is shown, which includes a PLL that is driven by a clock signal provided by clock circuitry 206.

Figure 3A:
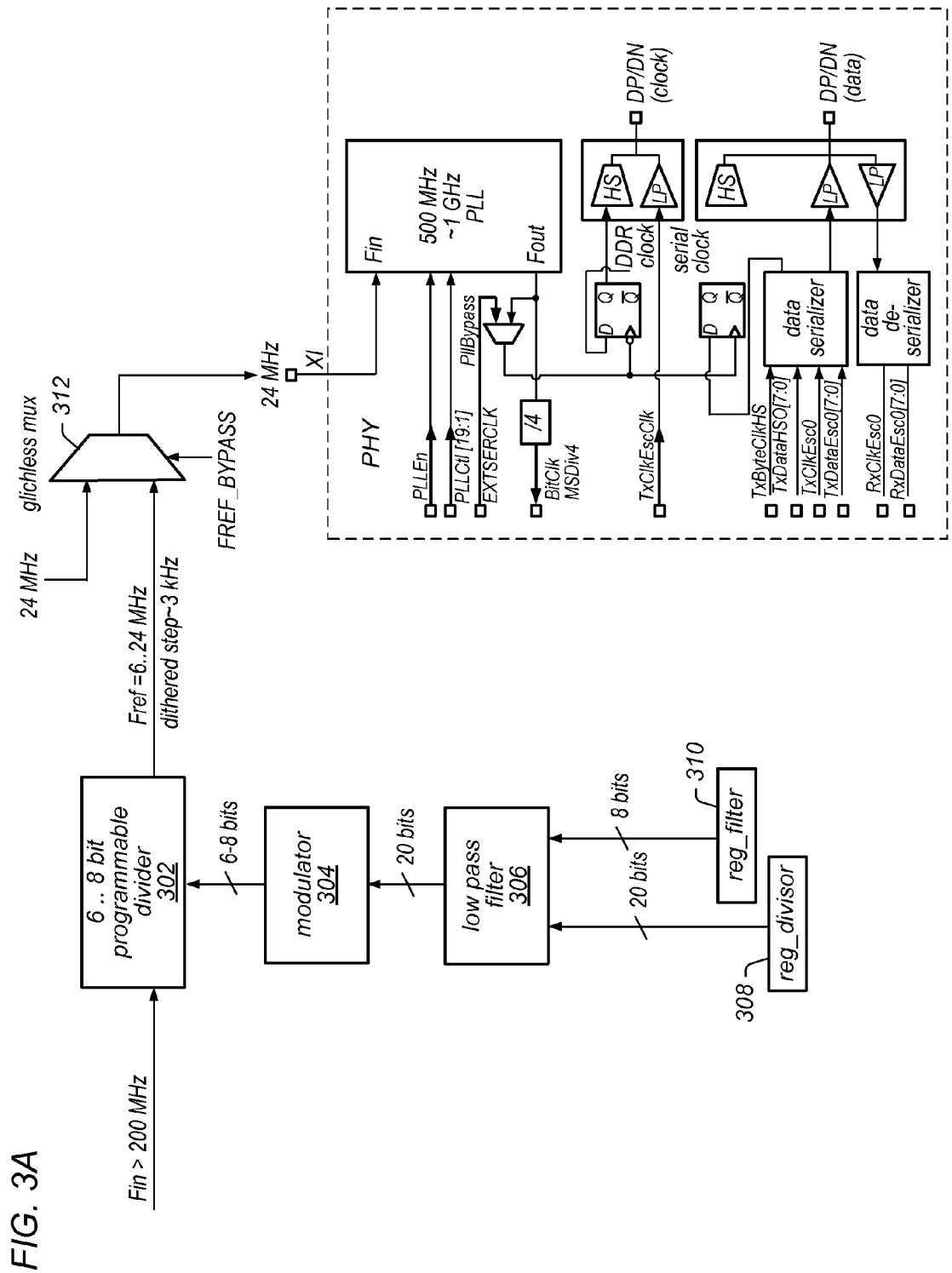
FIGS. 3A-4 are block diagrams of embodiments of circuits for adjusting a clock source of a PLL.

In FIG. 3A, two registers may be used, reg_divisor 308 and reg_filter 310. reg_divisor may be a programmable register (e.g., which may be programmed by software or some other entity, such as other circuitry) that may specify a divisor for the programmable divider 302 (effectively specifying a desired frequency of the clock signal to be provided to the PLL of the HSSI 208). The reg_filter may be used to specify how fast the current divisor or frequency can be changed from its current value to the specified divisor in reg_divisor 308. Accordingly, low pass filter 306 (which may be an IIR (infinite impulse response) filter) may receive outputs from these two registers and provide a modified divisor as output. The modified (or filtered) divisor may be modified in such a way that the PLL of the HSSI 208 does not lose lock in response to the change in clock frequency. Thus, by using the reg_filter, the filter 306 may modify the divisor in reg_divisor 308 in order to ensure that the PLL does not lose lock. This functionality may allow software or some other mechanism (e.g., other circuitry) to change the frequency of the clock provided to the HSSI PLL (effectively changing the HSSI clock frequency) from a first frequency to a second frequency, e.g., to mitigate or remove interference in a wireless communication channel. For example, the clock may be programmed to change from a frequency that is or will interfere with wireless communication to a frequency that will not interfere with the wireless communication.

Figure 4:
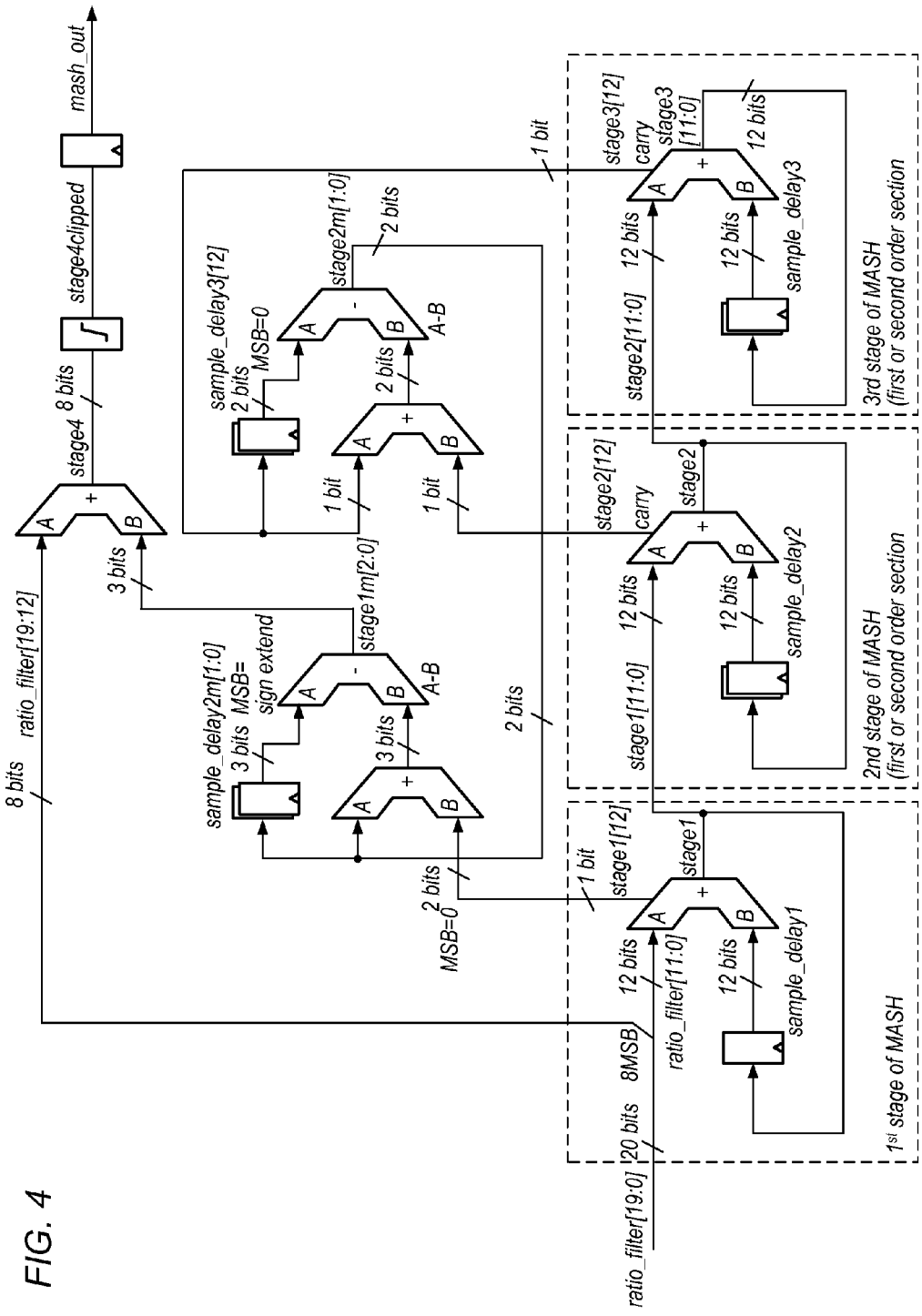

The filtered divisor from low pass filter 306 may be provided to modulator 304, which may be a sigma delta circuit (e.g., a $2^{nd}$ order sigma delta circuit, although other orders are envisioned, such as $1^{st}$, $3^{th}$, etc.). FIG. 4 illustrates one embodiment of the modulator 304. The modulator 304 may randomize (or pseudo-randomize) the filtered divisor (provided from filter 306). For example, the modulator 304 may be configured to generate a fractional ratio and keep spurs in the higher frequency range, which may be filtered out by the PLL. Finally, the programmable divider 302 may divide a higher frequency clock by the divisor provided by modulator 304 to produce a clocking signal that may be provided to the PLL of the MSSI 208. Glitchless mux 312 may select between the adjustable clock and a constant clock (in this case a 24 MHz clock) for provision to the PLL of the MSSI 208. Note that the constant clock may not have the benefit of mitigating or removing interference in the wireless communication channel(s).

Note that the above process may be performed over multiple iterations, e.g., beginning with a change to the reg_divisor 308. Additionally, within each iteration, the modulator 304 may modulate the received filtered divisor multiple times. Also within each iteration, the low pass filter 306 may slowly change the filtered divisor from the first iteration's filtered divisor until it reaches the value stored in the reg_divisor 308, based on the change in transition defined by the reg_filter 310.

Figure 3B:
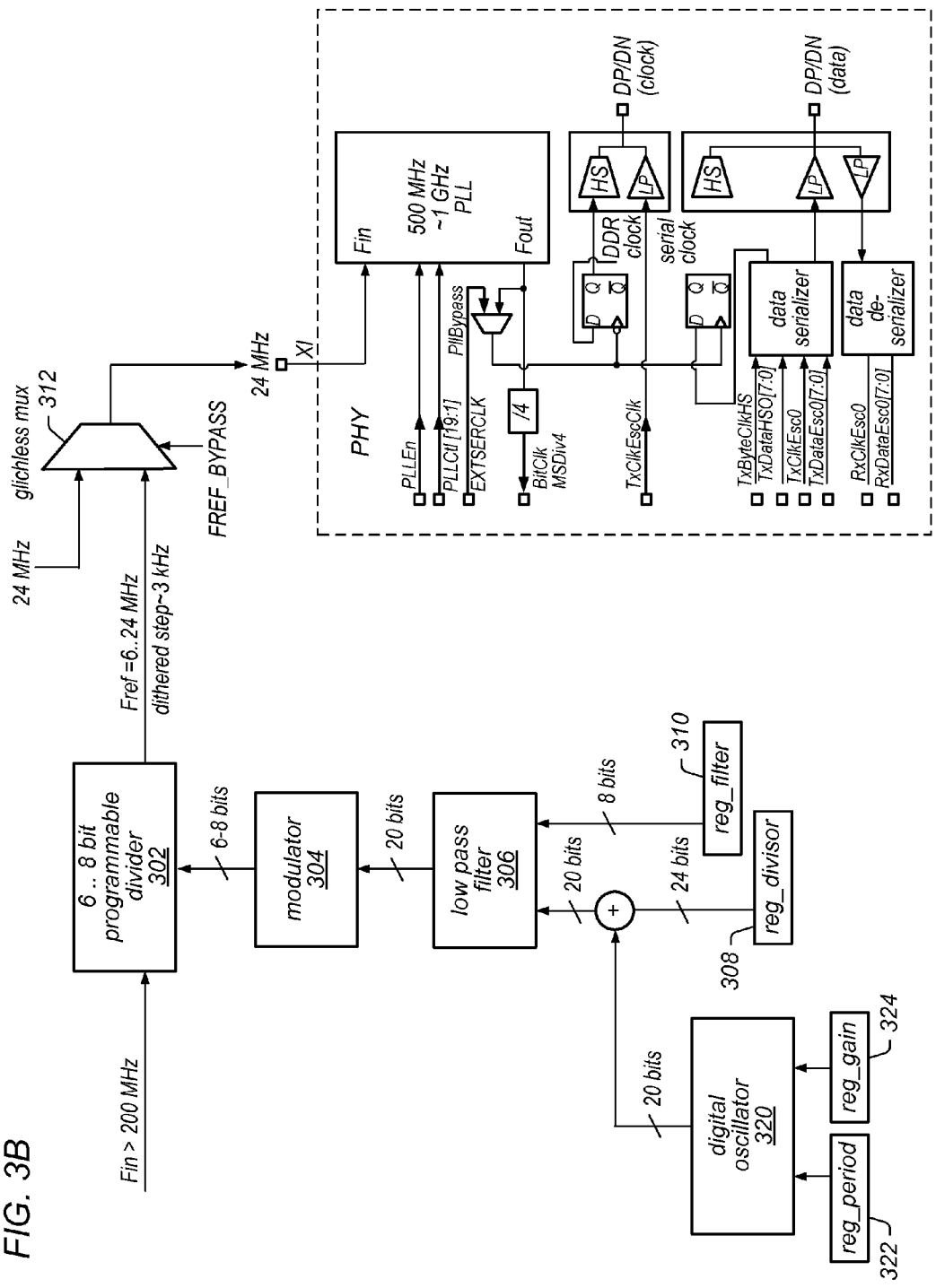

FIG. 3B illustrates a second embodiment, which operates similarly to FIG. 3A. However, as shown in FIG. 3B, a digital oscillator 320 is added to the reg_divisor 308 as input to the low pass filter 306. The digital oscillator 320 may receive a period and gain from reg_period 322 and reg_gain 324 to control the oscillator's output. By adding the digital oscillator 320, the divisor provided to the low pass filter changes over time, which results in the frequency of the HSSI clock varying over time. Accordingly, the harmonics of the HSSI clock may be spread among a wider frequency range and therefore lessen the strength of interference within wireless communication channel(s).

Figure 3C:
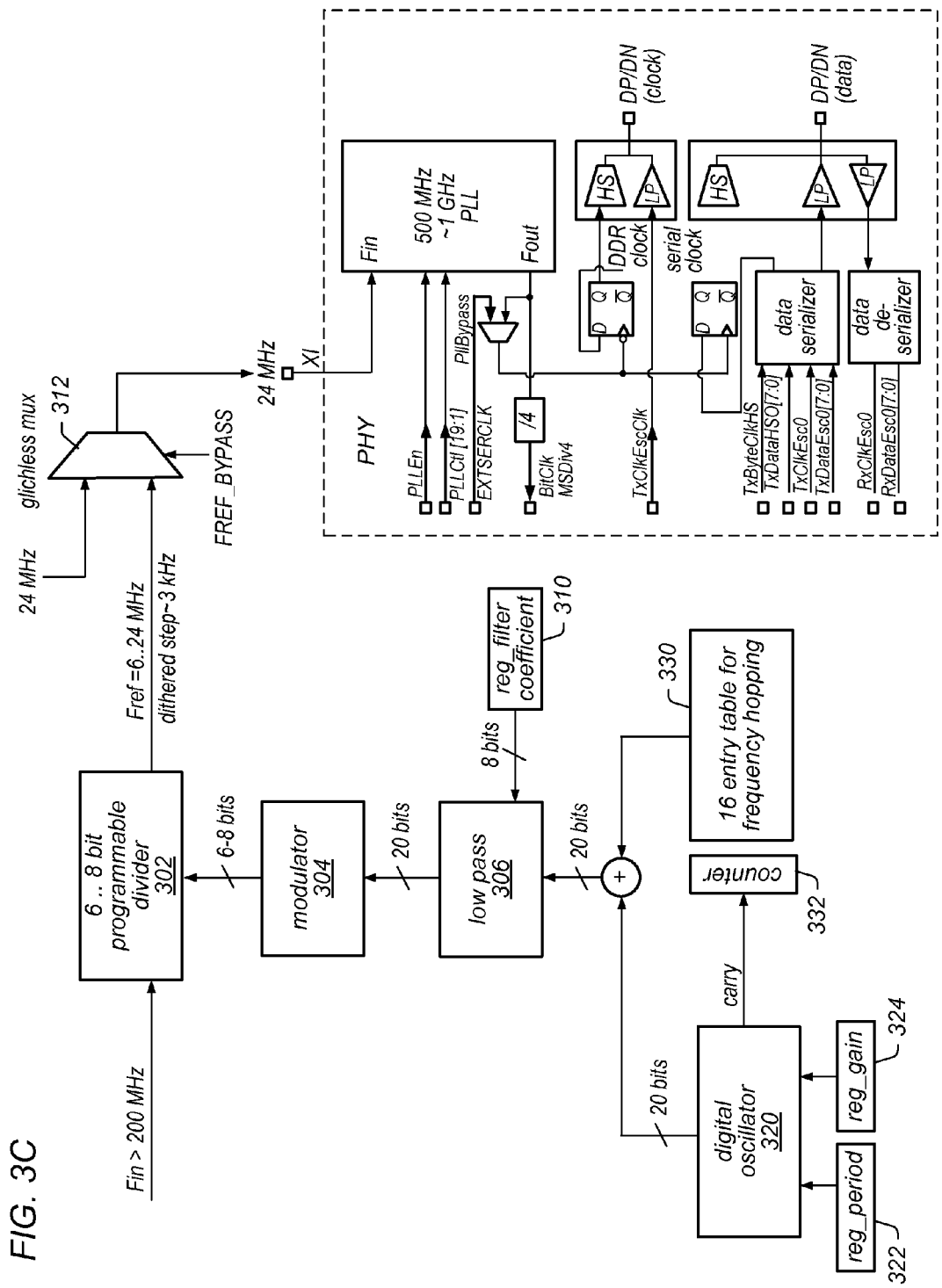

FIG. 3C illustrates a third embodiment, which operates similarly to FIG. 3B. However, as shown in FIG. 3C, instead of using reg_divisor 308, a table (e.g., a 16 entry table) may be used for specifying different frequencies. Similar to FIG. 3B, the selected divisor from this table may be added to the output of the digital oscillator as input to the low pass filter 306. The entry from the table may be selected by the counter 332, whose value may be modified according to the digital oscillator 320 (e.g., the carry from the digital oscillator 320).

Figure 5C:
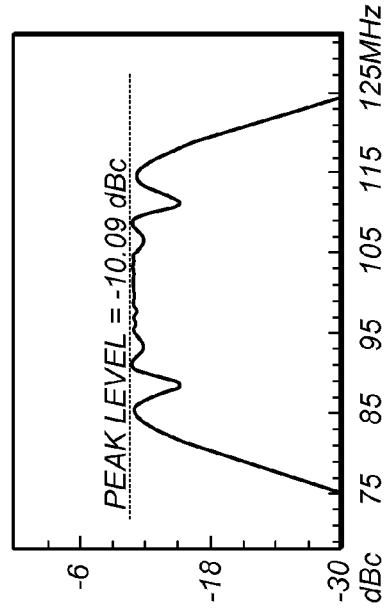
Figure 5C:
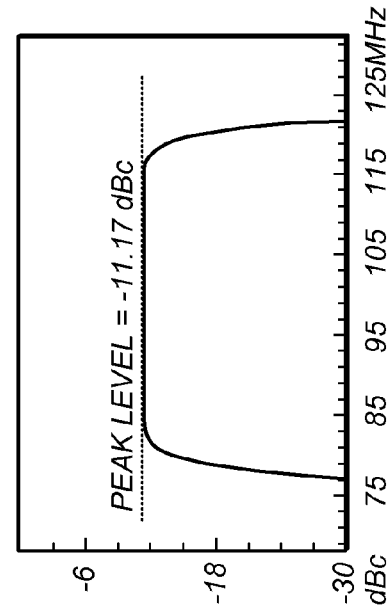
Figure 5D:
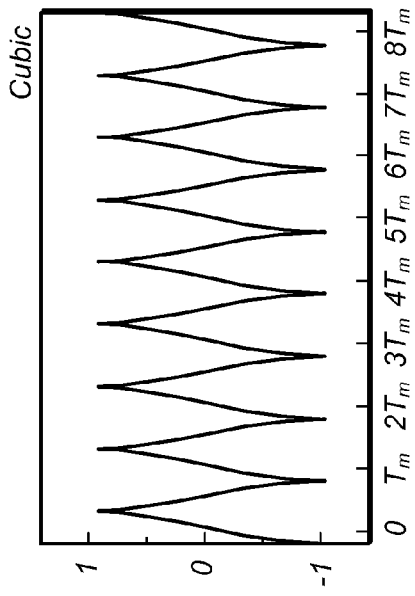
Figure 5D:
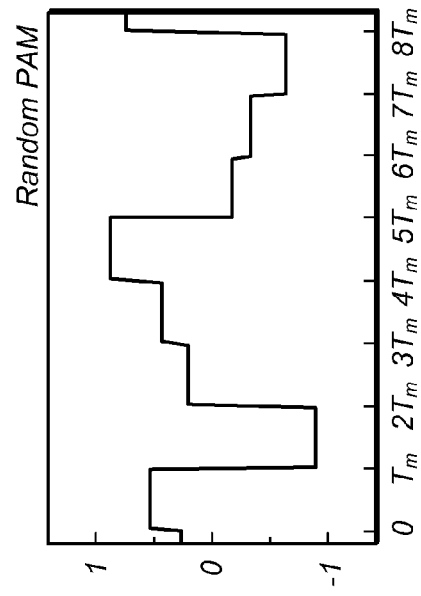

FIGS. 5A-5D illustrate exemplary oscillator outputs and resulting clock output power levels. As shown, a sinusoidal oscillator output results in a power output that is concave in between two peaks. A triangular oscillator output results in lower peaks and more constant power output level. FIG. 5C illustrates a cubic oscillator output with a power output that is similar (but marginally better) than the triangular wave of FIG. 5C. Finally, FIG. 5D illustrates a random oscillator output that results in a virtually rectangular power output level (but still rounded on the edges). The embodiment of FIG. 3B can be used to replicate the outputs shown in FIGS. 5A-5C, and the embodiment of FIG. 3C can be used to replicate the output of FIG. 5D. Note, however, that the embodiment of FIG. 5D essentially removes the need for programming the value of the divisor since the power level may be spread out enough to reduce the HSSI clock interference to an extent that wireless communication can occur without issues.

Thus, FIG. 3A illustrates an embodiment where the frequency of the clock can be modified by software or other means to move a frequency of the HSSI clock from a first frequency to another without losing lock. For example, the device may be communicating using wireless channels that the HSSI clock does not interfere with, but then may later switch to new wireless channels (e.g., to use a different wireless standard, to communicate with a new wireless device (e.g., during cell phone tower transfer), to avoid external interference, etc.) that the HSSI clock may interfere with. In response (or prior to using the new wireless channels), the value of the frequency or divisor register may be modified to avoid the wireless channel interference.

In FIG. 3C, the HSSI clock is essentially always changing, which spreads the potential interference to a degree that interference with any set of wireless channels may be negligible. However, it should be noted that the table in FIG. 3C may be programmed or changed by software, as desired. Finally, FIG. 3B illustrates an embodiment that has the capabilities of both solutions. Note that other embodiments may also be possible, e.g., where the values of the table in FIG. 3C are generated based on a specified frequency or divisor, e.g., such as the one stored in reg_divisor 308 of FIGS. 3A and 3B.

Figure 6A:
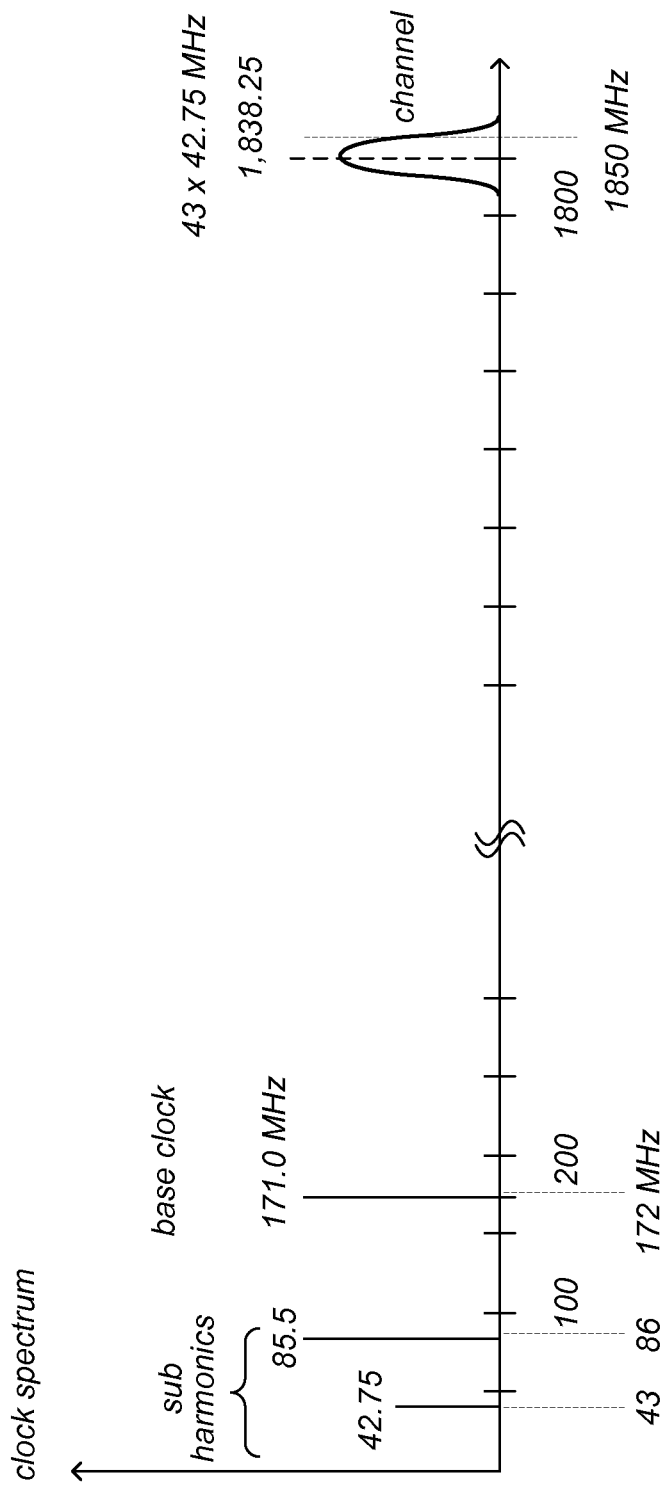
FIGS. 6A and 6B illustrate exemplary clock interference before and after clock source adjustment, according to some embodiments.
Figure 6B:
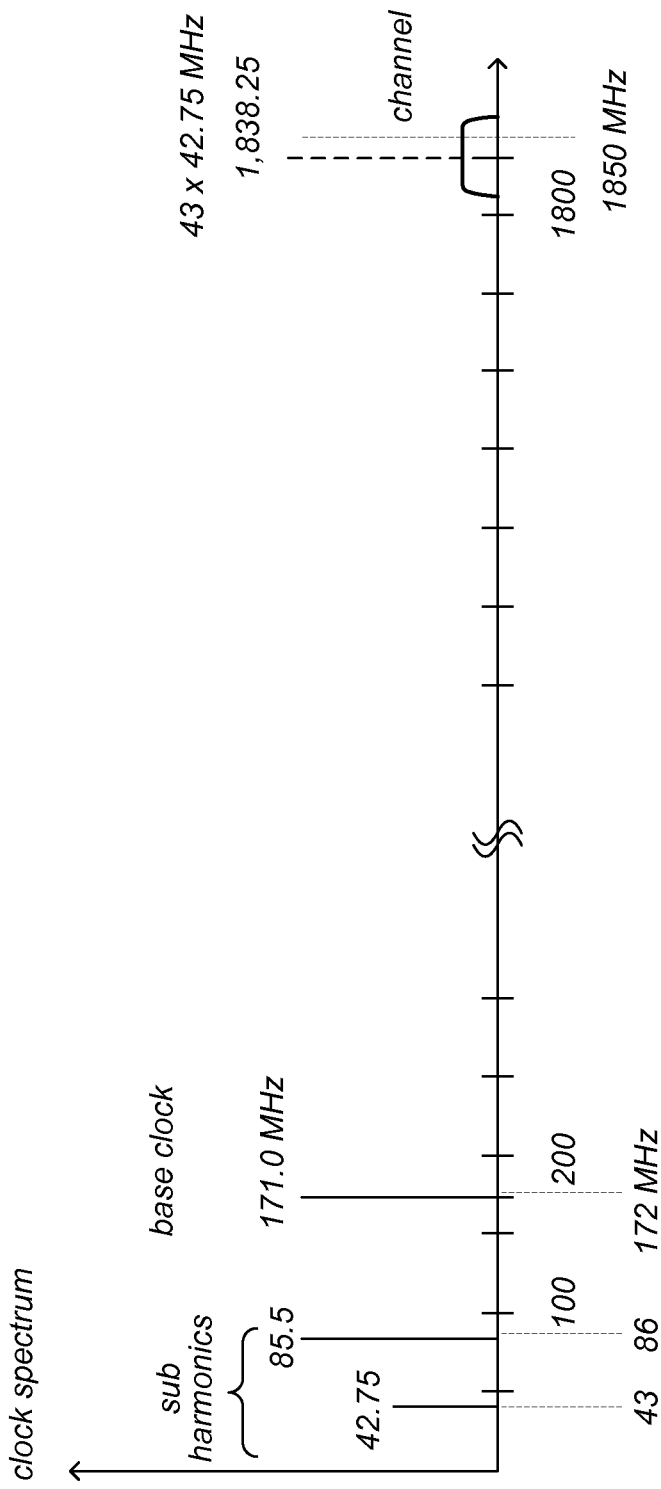

Finally, FIGS. 6A and 6B illustrate an exemplary clock frequency interference pattern before and after modification. More particularly, in FIG. 6A, a base clock at 171 MHz is used, which has sub harmonics at 85.5 and 42.75 MHz. In this particular example, the interference results from multiples of the $4^{th}$ sub-harmonic (171/4 MHz). In this example, only the $43^{rd}$ overtone of the 42.75 MHz sub harmonic is shown, which interferes with the 1850 MHz wireless channel. A more complete drawing would show a spectral line every 42.75 MHz, with a decreasing intensity as the frequency goes up. In this example, the power level on these spectral lines is in the −80 to −100 dB range.

As shown in FIG. 6B, this interference is greatly reduced using the techniques described herein. More particularly, the interfering frequency from the HSSI clock may be spread to modulation_depth/4*overtone, which is usually about 0.5% of the operating frequency. In this example, the spreading is over 9.1 MHz.

Figure 7:
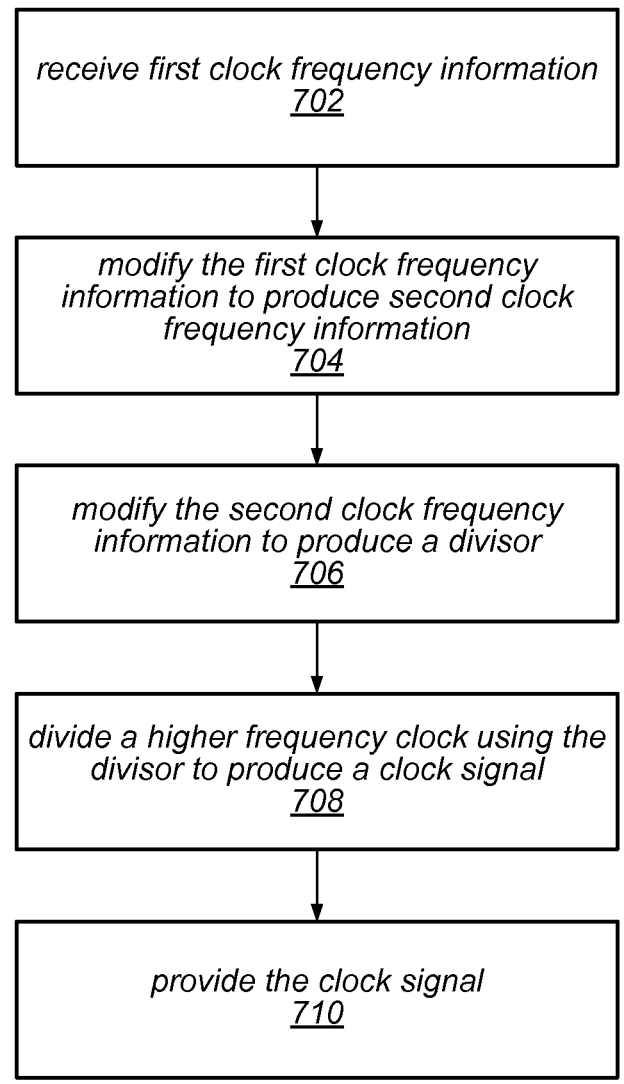
FIG. 7 is a flowchart diagram illustrating one embodiment of a method for adjusting a clock source of a PLL to reduce wireless communication interference.

FIG. 7—Adjusting a Clock Source of a PLL

FIG. 7 illustrates a method for adjusting a clock source of a PLL to reduce wireless communication interference. The method shown in FIG. 7 may be used in conjunction with any of the computer systems or devices shown in the above Figures, among other devices. For example, the method of FIG. 7 may particularly apply to FIGS. 3A-3C. In various embodiments, some of the method elements shown may be performed concurrently, in a different order than shown, or may be omitted. Additional method elements may also be performed as desired. As shown, this method may operate as follows.

In 702, first clock frequency information may be received. The first clock frequency information may be any of various information that is usable to generate a first clock frequency. For example, the first clock frequency information may be a divisor that, when applied to a higher frequency clock, produces a clock signal having the first clock frequency. The first clock frequency information may be provided from any of various sources, such as those illustrated in FIGS. 3A-3C. For example, the first clock frequency may be provided directly from a register specifying the first clock frequency information (e.g., a divisor). In further embodiments, the source of the first clock frequency information may be more elaborate. For example, the first clock frequency information may be based on the information stored in the register, but may be modified by an oscillator. In some embodiments, instead of a register specifying the clock frequency information, a table of information may be used. For example, the table may store multiple different divisors that may be selectable for provision as the first clock frequency information. Similar to above, this information may be modulated by the oscillator. Further, the oscillator may control a counter that may be used to select the information from the table that is then modulated by the oscillator and provided as the first clock frequency information. In embodiments using the oscillator, the second clock may be a spread spectrum clock that spreads its frequency and harmonics enough that interference of the wireless channels are mitigated without having to specifically change the frequency of the clock based on the wireless channels in use (or about to be in use). Thus, in these embodiments, the clock may be constantly modulated rather than being repeatedly programmed. In various embodiments, the clock information modulated by the oscillator may specify a "desired clock frequency". For example, the information stored in the register may specify the desired clock frequency of the second clock.

In 704, the first clock frequency information may be modified to produce second clock frequency information. For example, the first clock frequency information may be modified by a filter (e.g., a low pass filter). In more detail, the first clock frequency information may specify a clock frequency (e.g., the first clock frequency) that is different from the current clock frequency output by the second clock. Accordingly, the first clock frequency information may be modified to the second clock frequency information in a manner that prevents the PLL from losing lock in response to the changing clock frequency of the second clock. In one embodiment, the first clock frequency information may be modified using transition information (e.g., which may be stored in a register). The transition information may limit the amount of change of the current clock frequency in a manner that allows the PLL to retain lock. For example, the transition information may define a slope for changing the current clock frequency to that specified in the first clock frequency information.

In 706, the second clock information may be modified to produce a divisor. For example, the second clock information may be modified by a modulator, such as a sigma delta circuit.

In 708, the second clock may receive a higher frequency clock signal and divide that higher frequency clock signal by the divisor to produce the second clock signals.

In 710, the second clock signals may be provided to the PLL and may mitigate wireless communication interference.

As noted above, this method may be iterated multiple times. For example, each iteration may specify a new desired frequency (e.g., via the frequency register, the table of frequencies, etc.). That frequency may be modified one or more times within the iteration until the second frequency matches the first frequency. Within each of those iterations, the second frequency may be repeatedly modulated to produce the divisor.

Thus, FIG. 7 describes a method for producing clock signals as input to a PLL that mitigates wireless communication interference.

Figure 8:
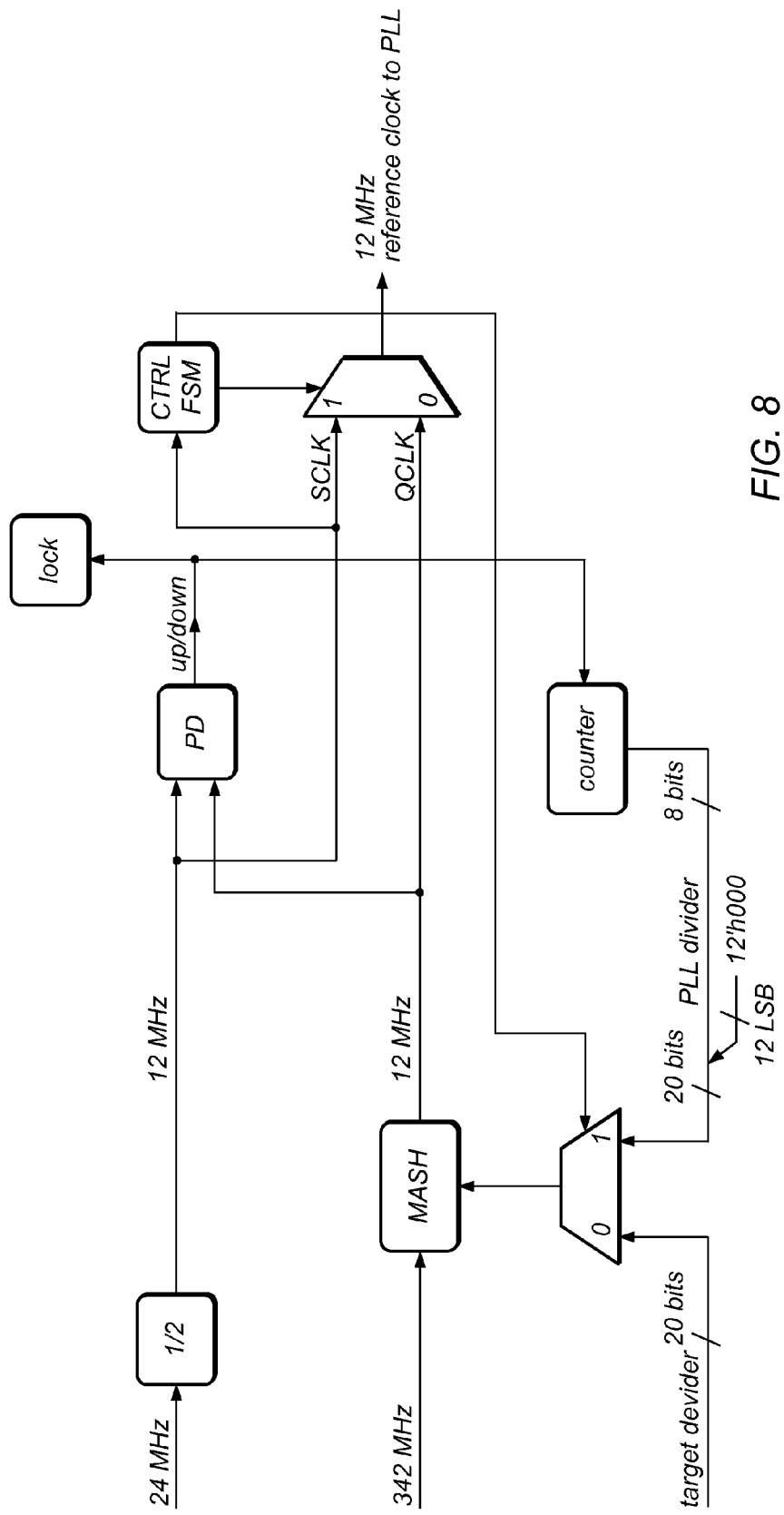
FIG. 8 is a block diagram of an embodiment of a circuit for changing a PLL clock source from a first clock to a second clock.

FIG. 8—Exemplary Block Diagram of Clock Selection Circuitry

FIG. 8 illustrates a block diagram of an embodiment of the clock selection circuitry that may apply to the embodiments described above. For example, in one embodiment, the clock selection circuitry of FIG. 8 may replace the glitchless mux illustrated in FIGS. 3A-3C.

In more detail, the adjustable or modulated clock described above may not be available to the wireless device at certain times. For example, during boot up of the device, the higher frequency clock used to drive the adjustable clock described above may not be available (e.g., until corresponding PLLs have been initialized). Accordingly, it may be necessary to drive the PLL using a first clock and then switch to a second clock (e.g., the adjustable clock) when the second clock is available. FIG. 8 illustrates a block diagram of one embodiment of clock selection circuitry that is able to perform this switch over.

More specifically, as shown in FIG. 8, the external 24 MHz clock (which may be generated by a crystal oscillator of the device) may be immediately available and can be used to generate a 12 MHz reference clock to the PLL of the serial interface using the ½ divider. However, when switching from the constant source clock to the adjustable clock, it is highly desirable that the switch does not generate a glitch or a variation in clock period on the reference clock to the PLL or the PLL may lose lock.

In the previous diagrams (e.g., FIGS. 3A-3C) a glitchless multiplexer was used to switch between two asynchronous clock sources. This glitchless mux avoids glitches (short negative pulses) and runt clock pulses but also creates a several (input) clock cycle long periods where the output stays fixed to one level, effectively loosing clock edges. In the diagram of FIG. 8, the latter is avoided by taking the high frequency input clock and effectively creating a PLL during the transition period using the fixed reference clock.

In FIG. 8, the MASH block may include the clock divider and sigma-delta modulator from the previous Figures (although variations are envisioned). Accordingly, when a transition from the constant 12 MHz clock (SCLK, top trace, derived from 24 MHz source) to the second clock (QCLK) derived from the 342 MHz clock is requested (e.g., using an enable bit, after the second clock is available), the control state machine (CTRL FSM) may be initiated by software (or other means). The control state machine may select the counter output as a source to the MASH, thereby closing the phase loop. The PD (e.g., a bang bang phase detector) may generate up/down signals to the counter, and accordingly, the counter output may change the divider ratio of the MASH until the MASH output is in phase and frequency locked with the 12 MHz clock. The lock may determine whether the two clocks are in phase using an average over 100 clock cycles, although other numbers of clock cycles are envisioned. Additionally, it should be noted that the counter may be initialized to a pre-defined value to facilitate the locking process.

The lock detector (lock) may signal the lock condition to the control state machine and the state machine may switch the multiplexer over from the first clock (SCLK) to the second clock (MASH clock). Then, the control state machine may transition the MASH input back to the TargetDivider (e.g., according to the embodiments described above). As described in those embodiments, this transition may require a smooth change in TargetDivider to avoid discontinuous change in frequency, which may be implemented by the filter circuitry described above. Thus, once switched, the second clock may operate according to the embodiment of FIG. 7 above.

A transition back to the constant 12 MHz SCLK would first bring SCLK and MASH clock back into lock before changing the clock route.

Figure 9:
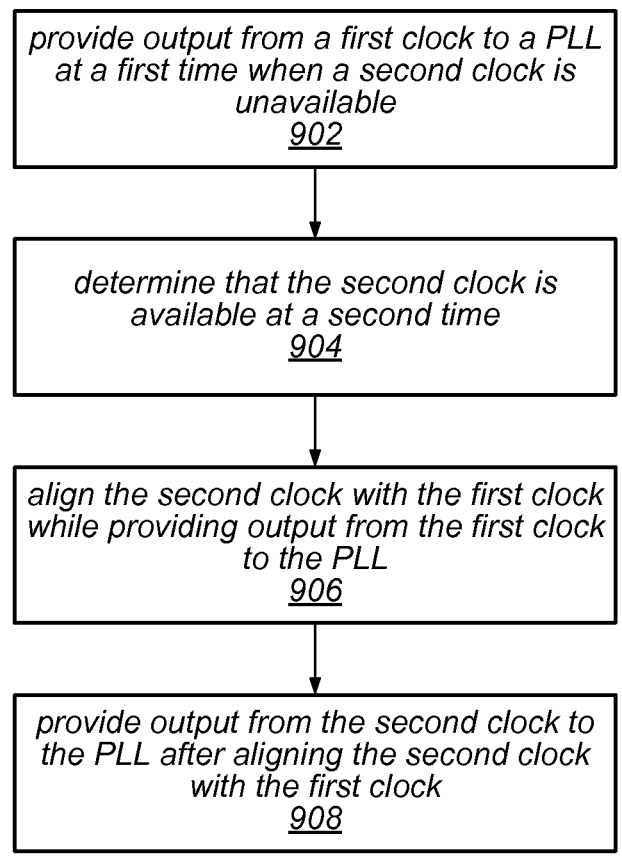
FIG. 9 is a flowchart diagram illustrating one embodiment of a method for changing a PLL clock source from a first clock to a second clock.

FIG. 9—Switching a PLL Clock Source from a First Clock to a Second Clock

FIG. 9 illustrates a method for switching a PLL clock source of a serial interface from a first clock source to a second clock source. The method shown in FIG. 9 may be used in conjunction with any of the computer systems or devices shown in the above Figures, among other devices. For example, the method of FIG. 9 may particularly apply to the diagram of FIG. 8. In various embodiments, some of the method elements shown may be performed concurrently, in a different order than shown, or may be omitted. Additional method elements may also be performed as desired. As shown, this method may operate as follows.

In 902, at a first time, the first clock may be available, but the second clock may not be available. For example, the first time may be when the wireless device is booting up or initializing. More specifically, the first clock may be based on or from a crystal oscillator that is available whenever the wireless device is turned on. The second clock, however, may be based on various other circuitry (e.g., higher frequency clocks that may depend on various PLLs being initiated or operational). Accordingly, the second clock may not be available during initiation. Accordingly, during the first time, the PLL of the serial interface may be driven by the clock signal of the first clock, which may be a static clock that does not mitigate or reduce interference in the wireless communication channels.

In 904, at a later second time (e.g., after boot or initialization of the wireless device), the method may determine that the second clock may become available for use. However, the first clock and second clock may not be aligned when the second clock becomes available. At the second time, were the second clock signal immediately provided to the PLL, a loss of lock may occur due to the misalignment of the clock signals of the first and second clock.

Accordingly, in 906, the second clock may be aligned with the first clock, while the clock signals of the first clock are provided to the PLL of the serial interface. For example, as described above, the second clock may be aligned with the first clock using a phase detector and a counter. The detection and adjustment may be repeated until the two clocks are in phase, e.g., over an average number of clock cycles, such as 100, although other numbers of clock cycles are envisioned.

Once aligned, in 908, the clock signals provided to the PLL may be switched from the first clock to the second clock.

Since the clock signals are aligned, the switching will not cause a loss of lock by the PLL. The alignment and switchover described above may be controlled by a state machine. Additionally, the alignment may be enabled using an enable bit, e.g., which may be set based on software executing on the wireless device.

Once the clock signals to the PLL are switched to the second clock, the second clock may be used in the manner described above to mitigate wireless communication interference.

Further Embodiments

Note that while the above has been described with respect to a HSSI, the ability to change the frequency of clocks may also apply to memory controllers, CPUs (e.g., for fine grain control of CPU clocks), GPUs, FMIs, or as a source to any type of PLL, as desired. The above approach may allow for fine grain (e.g., in the kHz order of magnitude) adjustment of clock sources to avoid frequency collisions. Additionally, the modulator can be programmed to different profiles or frequencies, as desired.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A clock generation unit comprising:
    a random modulator configured to receive current clock frequency information corresponding to a current clock frequency, and generate a divisor output based on the received current clock frequency information;
    a clock divider circuit configured to:
        receive the divisor output from the random modulator;
        receive an input clock having an input frequency; and
        generate a reference clock signal for a phase locked loop (PLL) by dividing the input frequency of the input clock by the divisor, wherein the reference clock signal has the current frequency; and
    first circuitry configured to:
        receive updated clock frequency information and a transition value, wherein the updated clock frequency information corresponds to an updated clock frequency that is different from the current clock frequency;
        adjust the clock frequency information based on the updated clock frequency information; and
        cause the PLL to retain lock with the reference clock signal by adjusting the clock frequency information according to the transition value when adjusting the clock frequency information based on the updated clock frequency information.

2. The clock generation unit of claim 1, wherein the current clock frequency information and the updated clock frequency information are each specified as a divisor to be applied to the input clock.

3. The clock generation unit of claim 1, further comprising:
    an oscillator configured to modulate the updated clock frequency information.

4. The clock generation unit of claim 1, further comprising:
    a divisor register and a transition register coupled to the first circuitry, wherein the updated clock frequency information is provided by the divisor register and the transition value is provided by the transition register.

5. The clock generation unit of claim 1, further comprising:
    a divisor register and a transition register coupled to the first circuitry, wherein the transition value is provided by the transition register; and
    an oscillator, wherein an output of the oscillator and an output of the divisor register are added together to produce the updated clock frequency information.

6. The clock generation unit of claim 1, further comprising:
    a table specifying a plurality of frequencies; and
    an oscillator, wherein an output of the oscillator and a value from the table together determine the updated clock frequency information.

7. The clock generation unit of claim 6, wherein the value from the table is provided according to a value of a counter, wherein the oscillator is configured to modify the value of the counter.

8. The clock generation unit of claim 1, wherein the first circuitry comprises a low pass filter.

9. The clock generation unit of claim 1, wherein the random modulator comprises a sigma delta circuit.

10. A method for generating a clock signal for a phase locked loop (PLL) with reduced radio frequency (RF) interference, the method comprising:
    receiving first clock frequency information, wherein the first clock frequency information is usable to generate a first clock frequency, wherein the first clock frequency is different than a current clock frequency;
    modifying the first clock frequency information to produce second clock frequency information according to transition information, wherein the second clock frequency information is usable to generate a second clock frequency, wherein the second clock frequency is different than the first clock frequency, wherein modifying the first clock frequency information according to the transition information prevents the PLL from losing lock;
    modifying the second clock frequency information to generate a divisor;
    dividing an input clock according to the divisor to generate a clock signal, wherein the clock signal varies around the second clock frequency based on said modifying the second clock frequency information; and
    providing the clock signal to the PLL;
    wherein said receiving the first clock information, said modifying the first clock frequency information to produce the second clock frequency information, said modifying the second clock frequency information, said dividing the input clock, and said providing the clock signal to the PLL are performed for a plurality of iterations.

11. The method of claim 10, wherein said modifying the second clock frequency information to generate the divisor, said dividing the input clock, and said providing the clock signal to the PLL are performed a plurality of times within each iteration.

12. The method of claim 10, wherein said modifying the second clock frequency information is performed using random or pseudo-random modification techniques.

13. The method of claim 10, wherein the first clock frequency information and the second clock frequency information specify a divisor for the input clock.

14. The method of claim 10, wherein the first clock frequency information is specified in a first register and wherein the transition information is specified in a second register.

15. The method of claim 10, further comprising:
providing the first clock frequency information based on an oscillator.

16. The method of claim 10, further comprising:
providing the first clock frequency information based on an oscillator and a value from a table comprising a plurality of divisors.

17. A system, comprising:
a clock divider circuit configured to receive an input clock and to divide a frequency of the input clock by a divisor to generate a reference clock for a phase locked loop (PLL);
a first circuit configured to:
receive first clock frequency information, wherein the first clock frequency information is usable to generate a first clock frequency, wherein the first clock frequency is different than a current clock frequency;
modify the first clock frequency information according to transition information and produce second clock frequency information based on the modified first clock frequency information, wherein modifying the first frequency information according to the transition information prevents the PLL from losing lock, wherein the second clock frequency information is usable to generate a second clock frequency, and wherein the second clock frequency is different than the first clock frequency;
a random modulator coupled to the first circuit and the clock divider circuit and configured to randomly modify the second frequency information, and generate the divisor based on the randomly modified second frequency information, wherein the reference clock varies around the second clock frequency based on the random modulator modifying the second clock frequency information; and
an oscillator configured to generate an oscillator output signal that modifies a third clock frequency information over time to generate the first clock frequency information, and consequently causes a frequency of the reference clock to vary over time around a desired clock frequency.

18. The system of claim 17, wherein the third clock frequency information is based on input from one of:
a table comprising a plurality of divisors; and
a register comprising a divisor.

19. The system of claim 18, wherein when the third clock frequency information is based on the table comprising a plurality of divisors, the oscillator is configured to select a divisor from the plurality of divisors as the third frequency information; and
wherein the desired clock frequency is specified according to the output of the oscillator and the selected divisor.

20. A mobile device, comprising:
a display;
display circuitry coupled to the display, wherein the display circuitry is configured to control graphics output to the display of the mobile device;
a high speed serial interface (HSSI) coupled to the display circuitry, wherein the HSSI comprises a phase locked loop (PLL), wherein the PLL is configured to receive an input clock signal and output an HSSI clock signal, wherein the display circuitry operates according to the HSSI clock signal;
an antenna for performing wireless communication using a plurality of wireless channels, wherein harmonics of the HSSI clock overlap with one or more of the wireless channels;
a first clock, wherein the first clock is configured to output a first clock signal;
an oscillator, wherein the oscillator is configured to produce an oscillating signal;
a filter coupled to the oscillator, wherein the filter is configured to produce a filtered divisor based on input derived from the oscillating signal and a first divisor, wherein the filtered divisor is modified from the input such that the PLL retains lock;
a modulator coupled to the filter, wherein the modulator is configured to provide a modulated divisor based on the filtered divisor, wherein the modulated divisor varies around the filtered divisor;
a divider coupled to the modulator, wherein the divider is configured to divide the first clock signal by the filtered divisor to produce the input clock signal to the PLL;
wherein the oscillator, the filter, the modulator, and the divider operate to reduce interference of the HSSI clock with the wireless communication.

21. The mobile device of claim 20, wherein the first divisor is specified in a register.

22. The mobile device of claim 20, wherein the first divisor is selected from a plurality of divisors stored in a table.

23. The mobile device of claim 22, wherein the first divisor is selected based on a counter controlled by the oscillator.

* * * * *